United States Patent [19]

Longueville

[11] Patent Number: 5,492,490
[45] Date of Patent: Feb. 20, 1996

[54] INSERT MOUNTING AND METHOD FOR INSERTING AND MOUNTING COMPONENTS IN PRINTED WIRING BOARD HOLES

[75] Inventor: Jacques Longueville, Oostkamp, Belgium

[73] Assignee: Siemens Aktiengesellschaft, Munich, Germany

[21] Appl. No.: 207,782

[22] Filed: Mar. 8, 1994

[30] Foreign Application Priority Data

Mar. 9, 1993 [DE] Germany ............... 93 03 464 U

[51] Int. Cl.⁶ ............................. H01R 13/42
[52] U.S. Cl. ................................ 439/751; 439/82
[58] Field of Search .................... 439/81, 82, 84, 439/751, 951, 873; 174/52 FP; 29/837, 838; 361/732, 735, 744, 773, 786, 790, 807, 809

[56] References Cited

U.S. PATENT DOCUMENTS 4,626,958  12/1986  Lockard et al. ............ 174/52 FP X
4,636,918  1/1987  Jodoin ........................ 361/790 X

FOREIGN PATENT DOCUMENTS 92113617  1/1993  Germany .

*Primary Examiner*—David L. Pirlot
*Assistant Examiner*—Jill DeMello
*Attorney, Agent, or Firm*—Herbert L. Lerner; Laurence A. Greenberg

[57] ABSTRACT

An insert mounting and a method for inserting and mounting components in holes of printed wiring boards, in particular for plug connectors or parts thereof, include connection pegs of two components being inserted in a T-shaped basic configuration into a hole in a printed wiring board from opposite sides of the printed wiring board, for fastening the two components in the printed wiring board hole. The connection pegs have a rectangular basic cross sectional shape. One of the connection pegs forms a crossbar of the T-shaped basic configuration and is introduced first into the printed wiring board hole. At least one of the connection pegs is elastically deformable for forming an elastic insertion zone of the connection pegs of the two components in a state in which the connection pegs are disposed in the printed wiring board hole.

10 Claims, 1 Drawing Sheet

INSERT MOUNTING AND METHOD FOR INSERTING AND MOUNTING COMPONENTS IN PRINTED WIRING BOARD HOLES

BACKGROUND OF THE INVENTION

FIELD OF THE INVENTION

The invention relates to an insert mounting and a method for inserting and mounting components, formed with a connection peg, in printed wiring board holes, wherein the connection pegs of the components have a basic shape with a rectangular cross section, in particular for plug connectors or parts thereof.

When components or component elements are disposed and fixed to printed wiring boards, an insert mounting is used which has become a conventional connection technique, with which solder-free, electrically and mechanically durable connections are made in through-contacted holes of printed wiring boards. In general, the insert mounting is employed to connect one component or one connection peg to one printed wiring board hole at a time. The connection pegs of the components often have a rectangular basic cross-sectional shape and are constructed in the most diverse ways with insertion zones of the most varied cross-sectional shapes.

However, for various reasons the available space in configurations of components or component elements on printed wiring boards is extremely limited. Due to the general trend toward miniaturization, for example, more and more connection points per unit of surface area are needed on a printed wiring board. Many ground connections are needed, particularly for high frequencies. Such a great number of connection points makes it more difficult to disentangle printed wiring boards and compels the use of multilayer printed wiring boards. That is true, for instance, when ground plates that are located on opposite sides of the printed wiring board are to be connected. Previously, that required two rows of holes, which wasted space and could lessen the shielding effect. Another option was to use the connection points of one side and then the other of the printed wiring board in alternation, but that limited the remaining space available for use in signal carrying.

SUMMARY OF THE INVENTION

It is accordingly an object of the invention to provide an insert mounting and a method for inserting and mounting components in printed wiring board holes, which overcome the hereinafore-mentioned disadvantages of the heretofore-known methods and devices of this general type and which create the most space-saving possible utilization of connection possibilities for mounting components in printed wiring board holes by the insertion technique.

With the foregoing and other objects in view there is provided, in accordance with the invention, an insert mounting and a method for inserting and mounting components in holes of printed wiring boards, in particular for plug connectors or parts thereof, comprising:

a) connection pegs of two components being inserted in a T-shaped basic configuration into a hole in a printed wiring board from opposite sides of the printed wiring board, for fastening the two components in the printed wiring board hole, the connection pegs having a rectangular basic cross sectional shape;

b) one of the connection pegs forming a crossbar of the T-shaped basic configuration and being introduced first into the printed wiring board hole; and c) at least one of the connection pegs being elastically deformable for forming an elastic insertion zone of the connection pegs of the two components in a state in which the connection pegs are disposed in the printed wiring board hole.

This kind of insert mounting makes it possible to connect two components, for instance two ground plates that are disposed on opposite sides of a printed wiring board, in the same printed wiring board holes. In other words, the mounting of two components or two connection pegs of two components can be performed from opposite sides of the printed wiring board in a single printed wiring board hole. As a result, only half as many printed wiring board holes are needed for such connections, and more space is available for other purposes, such as disentangling or signal carrying.

In accordance with another feature of the invention, the one connection peg forming the crossbar is elastically deformable, and the other of the connection pegs forms an upright member of the T-shaped basic configuration and is rigid.

In accordance with a further feature of the invention, the one connection peg forming the crossbar is preformed and adapted to a wall of the printed wiring board at the hole, and the other of the connection pegs forms an upright member and is elastically deformable.

In accordance with an added feature of the invention, the one connection peg forming the crossbar is locked in the longitudinal direction after being introduced into the printed wiring board hole.

In accordance with an additional feature of the invention, the one connection peg forming the crossbar has at least one detent element locking into place above an edge of the printed wiring board at the hole.

In accordance with a concomitant feature of the invention, the other connection peg forming the upright member has an elastic insertion zone, with an S-shaped or Z-shaped cross-sectional profile being impressed into the rectangular basic cross sectional shape on two opposed sides.

Other features which are considered as characteristic for the invention are set forth in the appended claims.

Although the invention is illustrated and described herein as embodied in an insert mounting and a method for inserting and mounting components in printed wiring board holes, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
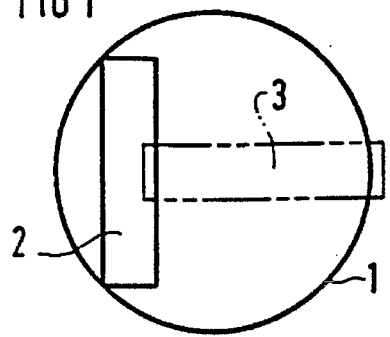
FIG. 1 is a diagrammatic, plan view of a basic layout of an insert mounting for connection pegs of two components in a printed wiring board hole.

Referring now in detail to the figures of the drawing as a whole, it is seen that for insertion mounting of two components in a metallized printed wiring board hole 1 from opposite sides of the printed wiring board, each component is formed with a respective connection peg 2 or 3 having a basic shape which is rectangular, as seen in cross section. The components are not shown herein in further detail but, for instance, are each formed of an upper or lower grounding or shielding plate of a shielded spring strip of a plug connector. As can be seen from FIG. 1 for the connection peg 2 of one component and for the connection peg 3 of the other component which is drawn in dot-dashed lines, the connection pegs 2 and 3 are oriented at right angles to one another in a T-shaped basic configuration. As a first step, the connection peg 2 of one component, forming a crossbar of the T, is introduced from one side of the printed wiring board into the printed wiring board hole 1 with play, as the first connection peg. After being introduced into the printed wiring board hole, in a second step the crossbar connection peg 2 is locked in the longitudinal direction. To that end, the crossbar connection peg 2 may be constructed with a detent element, for instance in the form of a snap hook, that locks into place across the edge of the printed wiring board at the hole 1. Instead, however, the crossbar connection peg 2 may also be retained by means of a support tool. In a third step, the connection peg 3 of the other component, which forms an upright member of the T, is inserted into the printed wiring board hole 1 from the other side of the printed wiring board. At least one connection peg 2 or 3 is elastically deformable, and the other connection peg is rigid, or else both connection pegs are elastically deformable, so that in the state in which they have been inserted into the printed wiring board hole 1, the connection pegs 2, 3 of the two components form an elastic insertion zone 4 shown in FIG. 2, in which the two connections press mutually against the wall of the printed wiring board at the hole and thus assure an electrically low-impedance and mechanically rugged connection.

Figure 2:
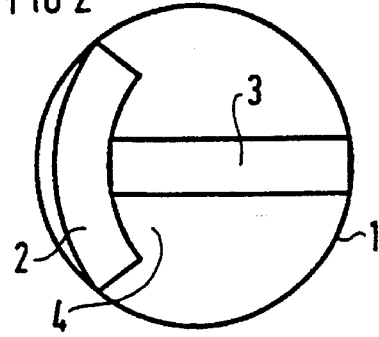
FIG. 2 is a plan view of the insert mounting of FIG. 1 in a state in which it is introduced into a printed wiring board hole.

In the embodiment of FIG. 2, which shows the insert mounting of FIG. 1 in the inserted state in the printed wiring board hole 1, the crossbar connection peg 2 of one component is elastically deformable, and the upright connection peg 3 of the other component is rigid, so that the crossbar connection peg 2 is made to bow resiliently toward the wall of the printed wiring board at the hole when the upright connection peg 3 is inserted.

Figure 3:
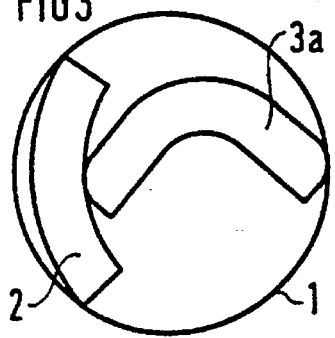
FIGS. 3 and 4 are plan views of further embodiments of an insert mounting.

In the embodiment of FIG. 3, both the crossbar connection peg 2 of the one component, which is the peg that is introduced first into the printed wiring board hole 1, and an upright connection peg 3a of the other component are elastically deformable, with the latter at least, for instance, having an elastic region, which enables an approximately rectangular bending of the upright connection peg 3a, as is shown in FIG. 3.

Figure 4:
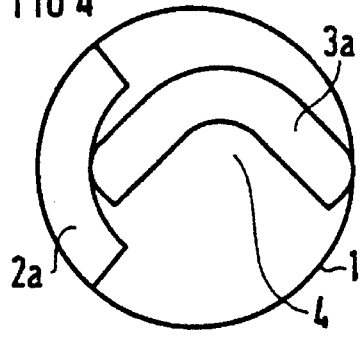

Finally, in the embodiment of FIG. 4, a crossbar connection peg 2a of the one component, which is again the peg first introduced into the printed wiring board hole 1, is deformed to adapt to the wall of the printed wiring board at the hole before being introduced, so that it rests flush against the wall of the printed wiring board hole. In this insert mounting, only the upright connection peg 3a of the other component is elastically deformable, so that the elasticity of the insertion zone 4 is produced solely by the upright connection peg 3a.

Figure 5:
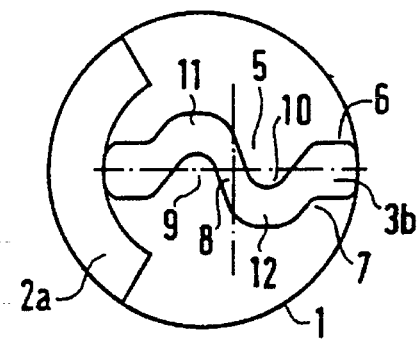
FIG. 5 is a plan view showing a further feature of the embodiment of FIG. 4.

As FIG. 5 shows in a further feature of the embodiment of FIG. 4, the elastic deformability of the upright connection peg may be obtained by providing that an upright connection peg 3b itself has a further elastic insertion zone 5 with a symmetrical S-shaped or Z-shaped cross-sectional profile. The insertion zone 5 is formed by impressing grooves 9, 10 which are laterally offset from a center axis 8 on two opposite sides 6, 7 into the upright connection peg 3b, in such a way that bulges 11, 12 protrude beyond the original material thickness of the rectangular basic shape of the upright connection peg 3b. The insertion zone 5 has high elasticity and may also be provided, for example, in an upright connection peg in combination with a crossbar connection peg 2 of FIG. 2 or FIG. 3.

I claim:

1. An insert mounting for inserting and mounting components in holes of printed wiring boards, comprising:

a) connection pegs of two components being inserted in a T-shaped basic configuration into a hole in a printed wiring board from opposite sides of the printed wiring board, for fastening the two components in the printed wiring board hole, said connection pegs having a rectangular basic cross sectional shape;

b) one of said connection pegs forming a crossbar of said T-shaped basic configuration and being introduced first into the printed wiring board hole; and c) at least one of said connection pegs being elastically deformable for forming an elastic insertion zone of said connection pegs of the two components in a state in which said connection pegs are disposed in the printed wiring board hole.

2. The insert mounting according to claim 1, wherein said one connection peg forming said crossbar is elastically deformable, and the other of said connection pegs forms an upright member of said T-shaped basic configuration and is rigid.

3. The insert mounting according to claim 1, wherein said one connection peg forming said crossbar is preformed and adapted to a wall of the printed wiring board at the hole, and the other of said connection pegs forms an upright member and is elastically deformable.

4. The insert mounting according to claim 3, wherein said other connection peg forming said upright member has an elastic insertion zone, with an S-shaped or Z-shaped cross-sectional profile being impressed into said rectangular basic cross sectional shape on two opposed sides.

5. A method for inserting and mounting components having a connection peg with a rectangular basic cross sectional shape in holes of printed wiring boards, which comprises:

inserting connection pegs of two components in a T-shaped basic configuration into a hole in a printed wiring board from opposite sides of the printed wiring board, for fastening the two components in the printed wiring board hole;

wherein the inserting step comprises:

initially introducing one of the connection pegs forming a crossbar of the T-shaped basic configuration into the printed wiring board hole; and elastically deforming at least one of the connection pegs for forming an elastic insertion zone of the connection pegs of the two components in a state in which the connection pegs are introduced into the printed wiring board hole.

6. The method according to claim 5, which comprises elastically deforming the one connection peg forming the crossbar, while the other of the connection pegs forms an upright member of the T-shaped basic configuration being rigid.

7. The method according to claim 5, which comprises preforming and adapting the one connection peg forming the crossbar to a wall of the printed wiring board at the hole, and elastically deforming the other of the connection pegs forming an upright member of the T-shaped basic configuration.

8. The method according to claim 7, which comprises locking the one connection peg forming the crossbar in the longitudinal direction after being introduced into the printed wiring board hole.

9. The method according to claim 7, which comprises impressing an S-shaped or Z-shaped cross-sectional profile of an elastic insertion zone into two opposed sides of the rectangular basic cross sectional shape of the other connection peg forming the upright member.

10. The method according to claim 8, which comprises impressing an S-shaped or Z-shaped cross-sectional profile of an elastic insertion zone into two opposed sides of the rectangular basic cross sectional shape of the other connection peg forming the upright member.

* * * * *